United States Patent

Nishi

[19]

[11] Patent Number: 5,897,311
[45] Date of Patent: Apr. 27, 1999

[54] SUPPORT BOAT FOR OBJECTS TO BE PROCESSED

[75] Inventor: Katsuo Nishi, Nakano-Ku, Japan

[73] Assignee: Tokyo Electron Limited, Tokyo-To, Japan

[21] Appl. No.: 08/654,413

[22] Filed: May 28, 1996

[30] Foreign Application Priority Data

May 31, 1995 [JP] Japan ................................. 7-156751

[51] Int. Cl.⁶ ........................................................ F27D 3/12
[52] U.S. Cl. ........................................... 432/239; 432/241
[58] Field of Search .................................... 432/239, 241, 432/253, 259

[56] References Cited

U.S. PATENT DOCUMENTS

| | | | |
|---|---|---|---|
| 4,943,234 | 7/1990 | Sohlbrand | 432/253 |
| 5,316,472 | 5/1994 | Niino et al. | 432/239 |
| 5,360,336 | 11/1994 | Monoe | 432/241 |
| 5,516,283 | 5/1996 | Schrems | 432/241 |
| 5,556,275 | 9/1996 | Sakata et al. | 432/239 |

FOREIGN PATENT DOCUMENTS

60-92826  3/1985  Japan .

Primary Examiner—Henry A. Bennett
Assistant Examiner—Gregory A. Wilson
Attorney, Agent, or Firm—Smith, Gambrell & Russell, LLP; Beveridge, DeGrandi, Weilacher & Young Intellectual Property Group

[57] ABSTRACT

A support boat for objects-to-be-processed including a plurality of support shelves formed in multi-stages spaced from each other by a vertical pitch for mounting a plurality of objects-to-be-processed which are to be heat treated in a vertical heat treatment apparatus; and a plurality of support bars for interconnecting the support shelves vertically spaced from each other and holding the same, the support boat comprising a light shielding plate disposed above an uppermost one or below a lowermost one of the support shelves for blocking heat rays from a heater for heating, whereby abrupt heating of central parts of those of the objects-to-be-processed which are positioned near the top or the bottom of the support boat is suppressed, and all the objects-to-be-processed can have substantially the same heat history.

6 Claims, 8 Drawing Sheets

SUPPORT BOAT FOR OBJECTS TO BE PROCESSED

BACKGROUND OF THE INVENTION

The present invention relates to a support boat (wafer boat) for objects to be processed which is used in a vertical heat processing apparatus for heat treating semiconductor wafers, etc.

Generally, various heat treatment apparatuses are used in oxidizing the surfaces of objects to be processed, such as semiconductor wafers, glass substrates of amorphous Si for use in LCDs, etc., and in forming diffused layers, silicon oxide films, silicon nitride films, etc. on the surfaces of the objects to be processed.

As one of such heat treatment apparatuses is noted as "fast thermal process" (abbreviated as FTP) which can fast increase/decrease temperatures for the purpose of suppressing as much as possible formation of natural oxide films on objects to be processed which are immediately before or after treatments to thereby meet demand for improved characteristics of formed films.

The FTP can achieve temperature increasing speeds and temperature decreasing speeds of about 100° C./min which is higher in contrast to, e.g., 3–4° C. temperature increasing and decreasing speeds of the usual heat treatment apparatuses, and can form films of higher quality.

For a treatment, semiconductor wafers are loaded into a processing furnace, mounted on a support boat for supporting a number of wafers horizontal on multi-stages spaced from each other by a certain vertical pitch. What is a problem upon fast temperature increase is how to increase temperatures, maintaining the temperatures uniform in the wafer surfaces. That is, temperatures tend to rise faster at peripheral parts of the wafers near a heater for heating, and the temperatures tend to delay in rising at central parts of the wafers remote from the heater. To prevent such phenomena, wafers are supported by ring-shaped circular support shelves for the purpose of suppressing the faster temperature rise of the peripheral parts of the wafers.

Such temperature increase of wafers will be explained with reference to FIGS. 7 and 9.

Figure 7:
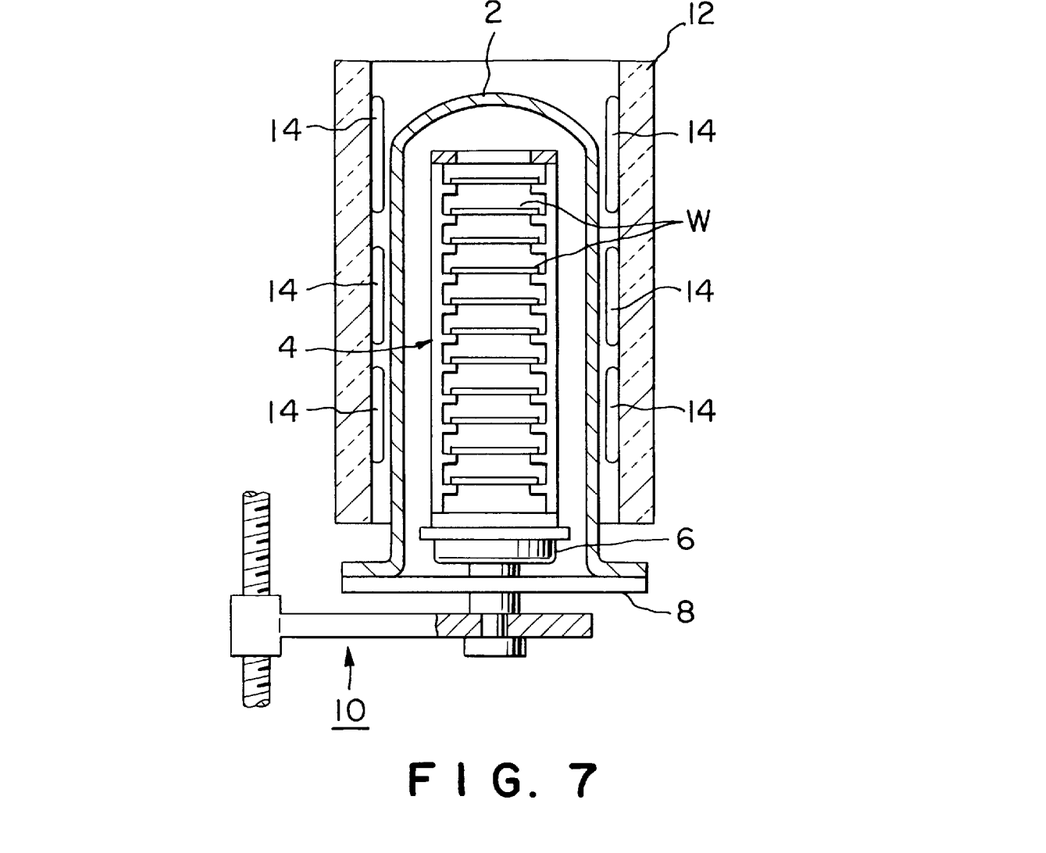
FIG. 7 is a vertical sectional view of a vertical FTP accommodating the conventional support boat for objects-to-be-processed.
Figure 8:
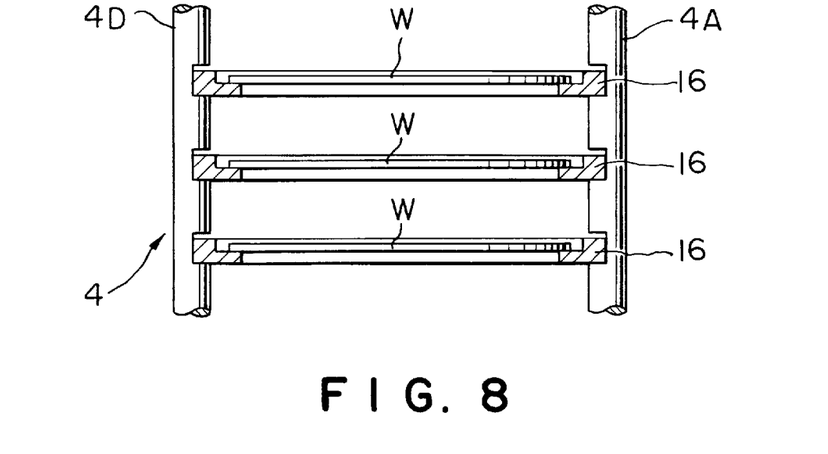
FIG. 8 is an enlarged partial view of the conventional support boat of FIG. 7.

FIG. 7 is a schematic vertical sectional view of the generally used in FTPs. FIG. 8 is an enlarged partial view of the support boat for wafers. A processing vessel 2 has the bottom opened and has a single tubular or a double tubular structure. Wafers W are loaded in the processing vessel 2, mounted horizontal on multi-stages of a support boat of, e.g., quartz or SiC, which are spaced from each other by a prescribed vertical pitch. Peripheral parts of the wafers W are supported by the support boat 4 at, e.g., 4 or 6 points. The support boat 4 is mounted on a lid 8 through a heat insulating cylinder 6. The opening in the bottom of the processing vessel 2 is closed tight by the lid 8 for a treatment. The lid 8 is connected to a lift mechanism 10, such as a boat elevator, and moves the support boat 4 up and down into and out of the processing vessel 2 when the wafers are transferred.

A number of heaters 14 for heating mounted on the inside wall of a cylindrical heat insulating member 12 are disposed around the processing vessel 2, and heat the processing vessel 2 at the side thereof.

Especially the heaters 14 are not usual ones but special heaters of molybdenum disilicate or others, which provides high calories per a unit area, so as to enable the fast temperature increase.

By the use of such special heaters having high calories per a unit area as the heaters 14, the fast temperature increase of the treatment apparatus can be attained as described above, but peripheral parts of the wafers near the heaters 14 tend to faster increase temperatures than central parts thereof remote from the heaters 14. As a result, it is impossible to increase temperatures, maintaining the temperatures uniform in the surfaces of the wafers.

As shown in FIG. 8, ring-shaped support shelves 16 are provided in support bars 4A of the support boat 14, and peripheral parts of the wafers W are held on the support shelves 16. Because of a certain heat capacity of the support shelves 16, temperature increase speeds here are a little mitigated, and resultantly the temperature increase is conducted, retaining temperatures uniform in the surfaces of the wafers W.

Figure 9A:
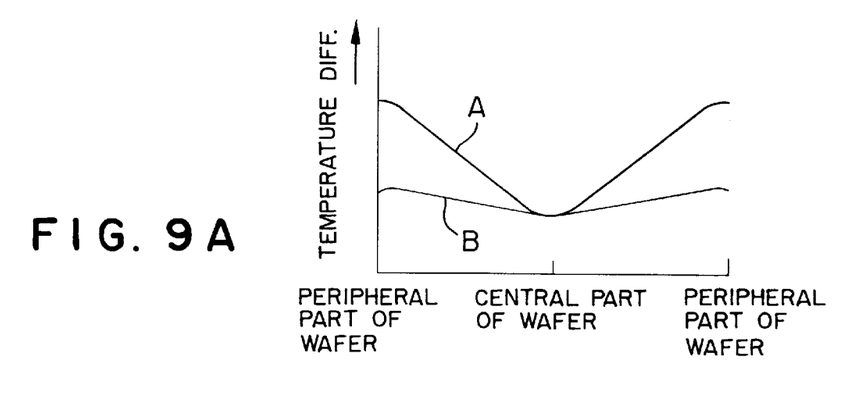
FIGS. 9A and 9B are graphs of intra-surface temperature distributions of wafers mounted on the conventional support boat.
Figure 9B:
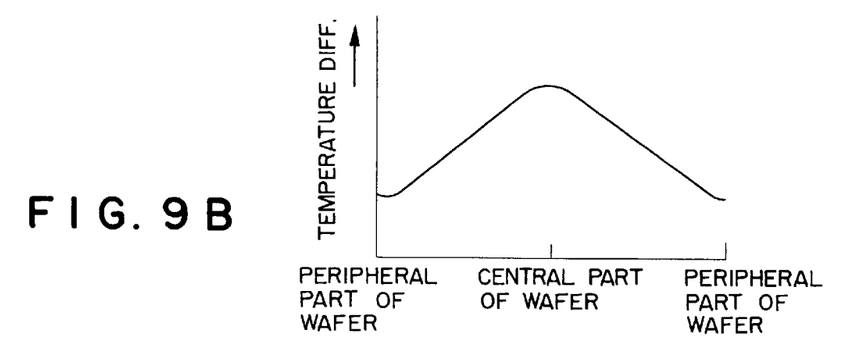

A state of the wafers during the temperature increase is shown in FIG. 9A. FIG. 9A shows a temperature distribution in the surfaces of the wafers during the temperature increase. In FIG. 9A, the curve A indicates a temperature distribution of the support shelves supporting the wafers W at three points. Peripheral parts of the wafers have a larger temperature increase, and central parts of the wafers have a considerably lower temperature in comparison with the peripheral parts. The curve B indicates a temperature distribution of the wafers at the ring-shaped support shelves, and shows the temperature increase of a preferable characteristic that a heat capacity of the ring-shaped support shelves suppresses the temperature increase of the peripheral parts of the wafers to some extent.

By the use of the ring-shaped support shelves to support the wafers W as described above, the temperature increase on the peripheral parts can be suppressed to obtain the improved temperature characteristic on most of the wafers as explained in FIG. 9A. Inversely on some sheets of the wafers W at the upper and the lower ends of the support boat, as shown in FIG. 9B, the temperature increase is larger at the central parts of the wafers than at the peripheral parts thereof. Inversion of the heat distribution takes place with respect to the distribution of FIG. 9A.

A cause for such inversion of the heat distribution is that heat from the heaters to the central parts of the wafers tends to be blocked by those of the wafers which are not positioned near the upper end of the support boat and are vertically adjacent to each other, and fail to reach those wafers. Those of the wafers near the upper end of the support boat are generally subjected to larger calories because the upper end of the support boat is exposed to the heaters. Accordingly the ring-shaped support shelves inversely acts to cause the inversion of the temperature distribution shown in FIG. 9B.

Figure 10:
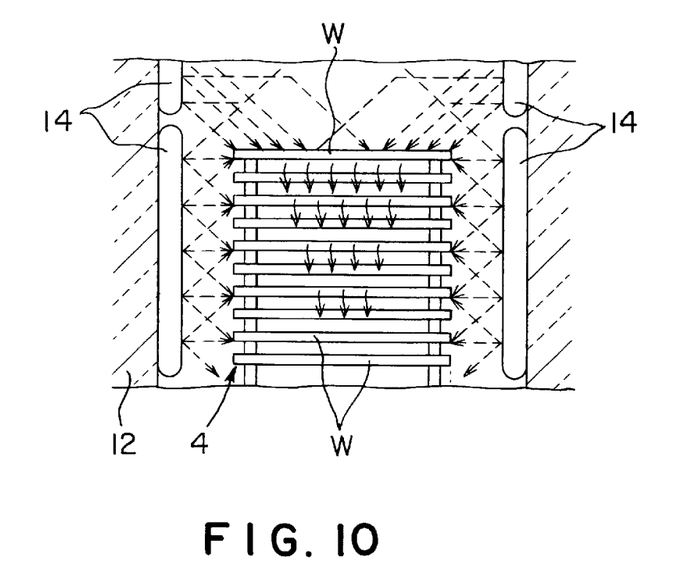
FIG. 10 is a schematic view explaining heating of wafers near the top of the support boat accommodated in the vertical FTP.

FIG. 10 is a schematic view of the heat conduction near the upper end of the support boat in this time. In FIG. 10 direct heat from the heaters 14 is indicated by the broken arrows, and the heat conduction between the wafers is indicated by the wavy arrows. As apparent in FIG. 10, first the top end of the support boat is heated, and the heat is conducted to the first top one of the wafers and the support shelf supporting the first top wafer and sequentially to the second top one and to the third top one. The heat is not easily conducted to the central parts of ones of the wafers on the intermediate support shelves in comparison with those of the wafers on upper support shelves, and accordingly a proper temperature distribution is gradually formed.

Thus the inversion of the heat distribution occurs on some of the wafers at the upper ends of the support boat and have a heat history different from that of the rest wafers. This is unfavorable to electric characteristics. For preventing this occurrence, a number of dummy wafers, which are unusable as product wafers must be mounted on the side of the upper end of the support boat, which not only lowers throughputs, but also needs an accordingly longer furnace length of the heat treatment apparatus. These are problems.

SUMMARY OF THE INVENTION

In view of the above-described problems of the conventional heat treatment apparatus, the present invention was made to effectively solve the problems. An object of the present invention is to provide a support boat (wafer boat) for objects to be processed which enables those of the objects-to-be-processed near the top of the support boat and the rest objects-to-be-processed to have substantially the same heat history.

To this end, the support boat for objects-to-be-processed according to the present invention includes a plurality of support shelves formed in multi-stages spaced from each other by a vertical pitch for mounting a plurality of objects-to-be-processed which are to be heat treated in a vertical heat treatment apparatus; and a plurality of support bars for interconnecting the support shelves vertically spaced from each other and holding the same, the support boat comprising a light shielding plate disposed above an uppermost one of the support shelves for blocking heat rays from a heater for heating.

In the present invention having the above-described structure, the light shielding plate for blocking heat rays is provided above the uppermost support shelf of the support boat and on the top of the support boat, whereby direct light from the heater of the vertical heat treatment apparatus can be blocked by the light shielding plate, so that those of the objects-to-be-processed near the top of the support boat and those thereof on the intermediate support shelves can be thermally in the same environment. Accordingly, the inversion of temperature distributions as shown in FIG. 9B can be suppressed, and those of the objects-to-be-processed near the top of the support boat and those thereof on the intermediate support shelves of the support boat can have the same heat history.

DETAILED DESCRIPTION OF PREFERRED EMBODIMENTS

One embodiment of a support boat for supporting objects to be processed according to the present invention will be explained with reference to the drawings attached hereto.

Figure 1:
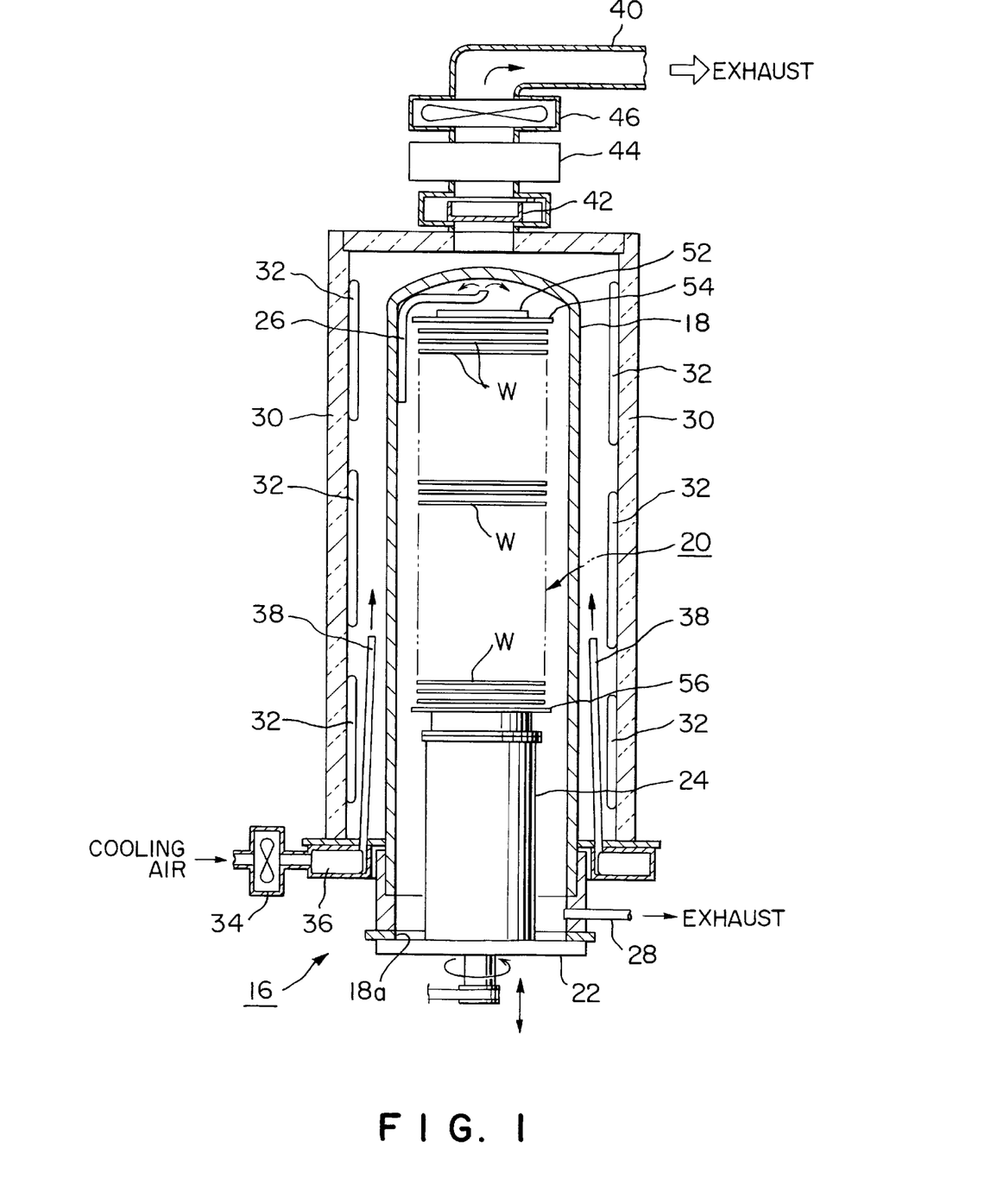
FIG. 1 is a vertical sectional view of a vertical FTP accommodating the support boat for objects to be processed.
Figure 2:
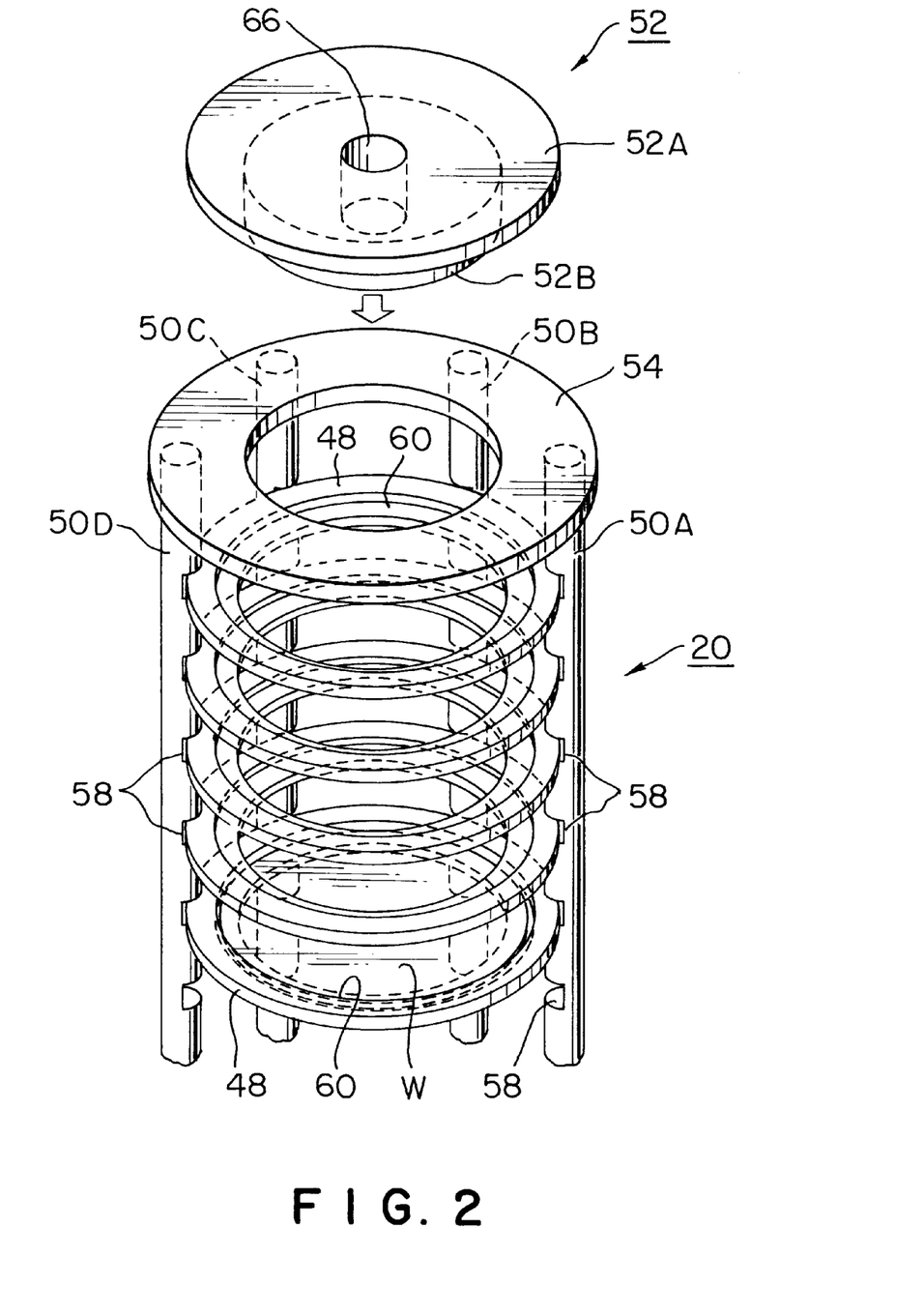
FIG. 2 is a broken perspective view of the top of the support boat for objects-to-be-processed according to the present invention, and the light shielding plated mounted thereon.
Figure 3:
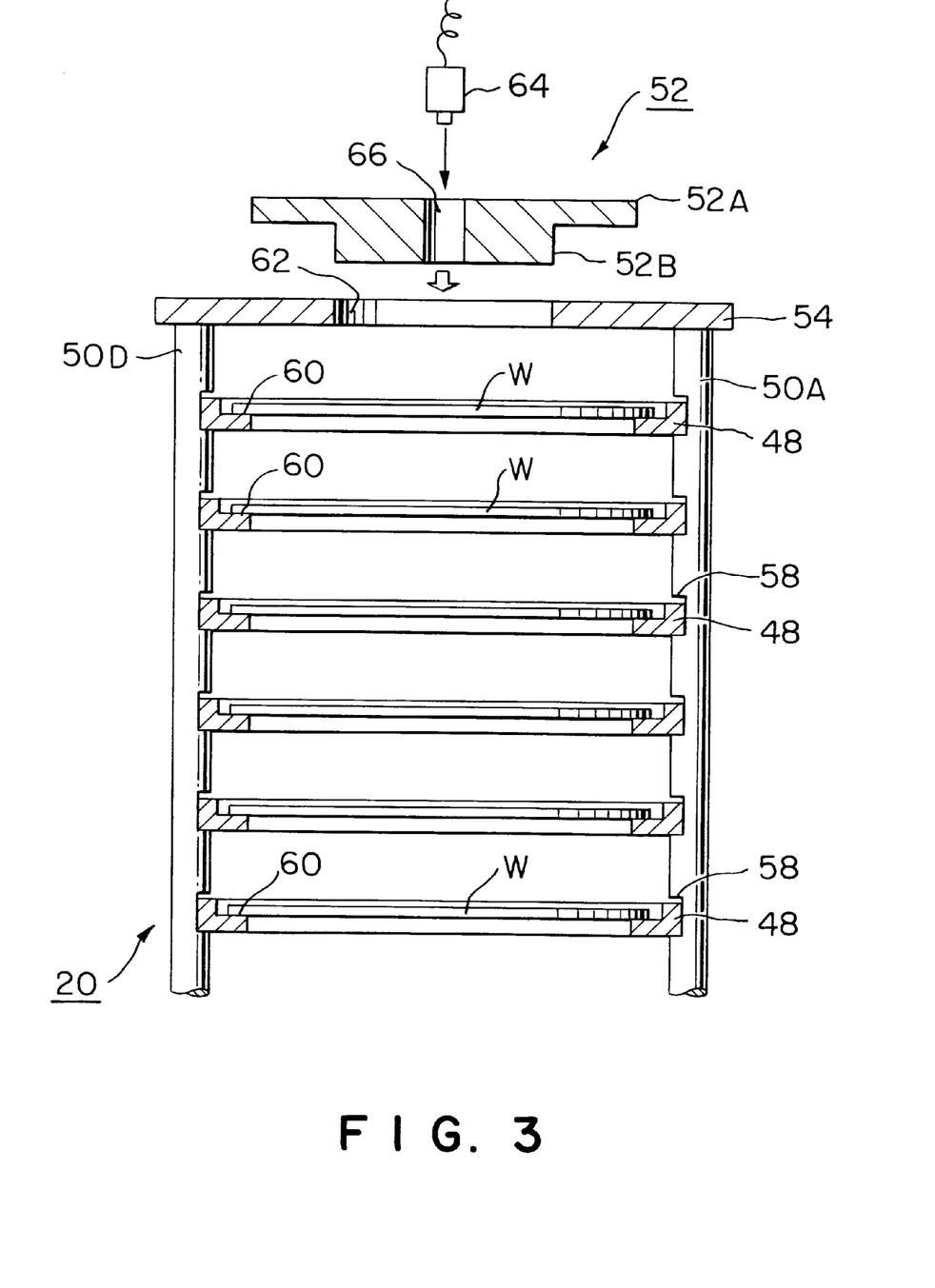
FIG. 3 is a broken vertical sectional view of the top of the support boat and the light shielding plate.
Figure 4:
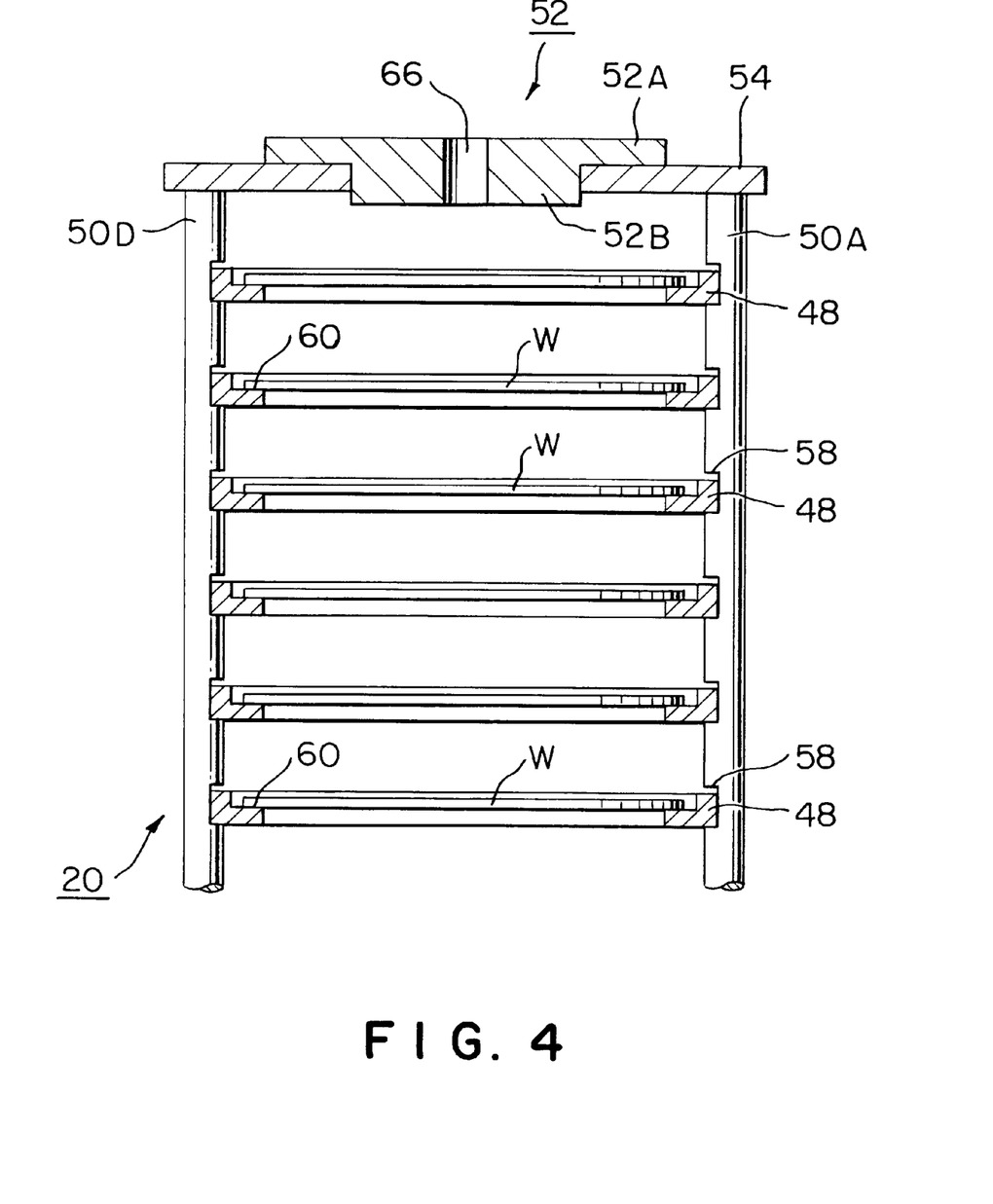
FIG. 4 is a vertical sectional view of the support boat and the light shielding plate shown in FIG. 2 which are assembled.
Figure 5:
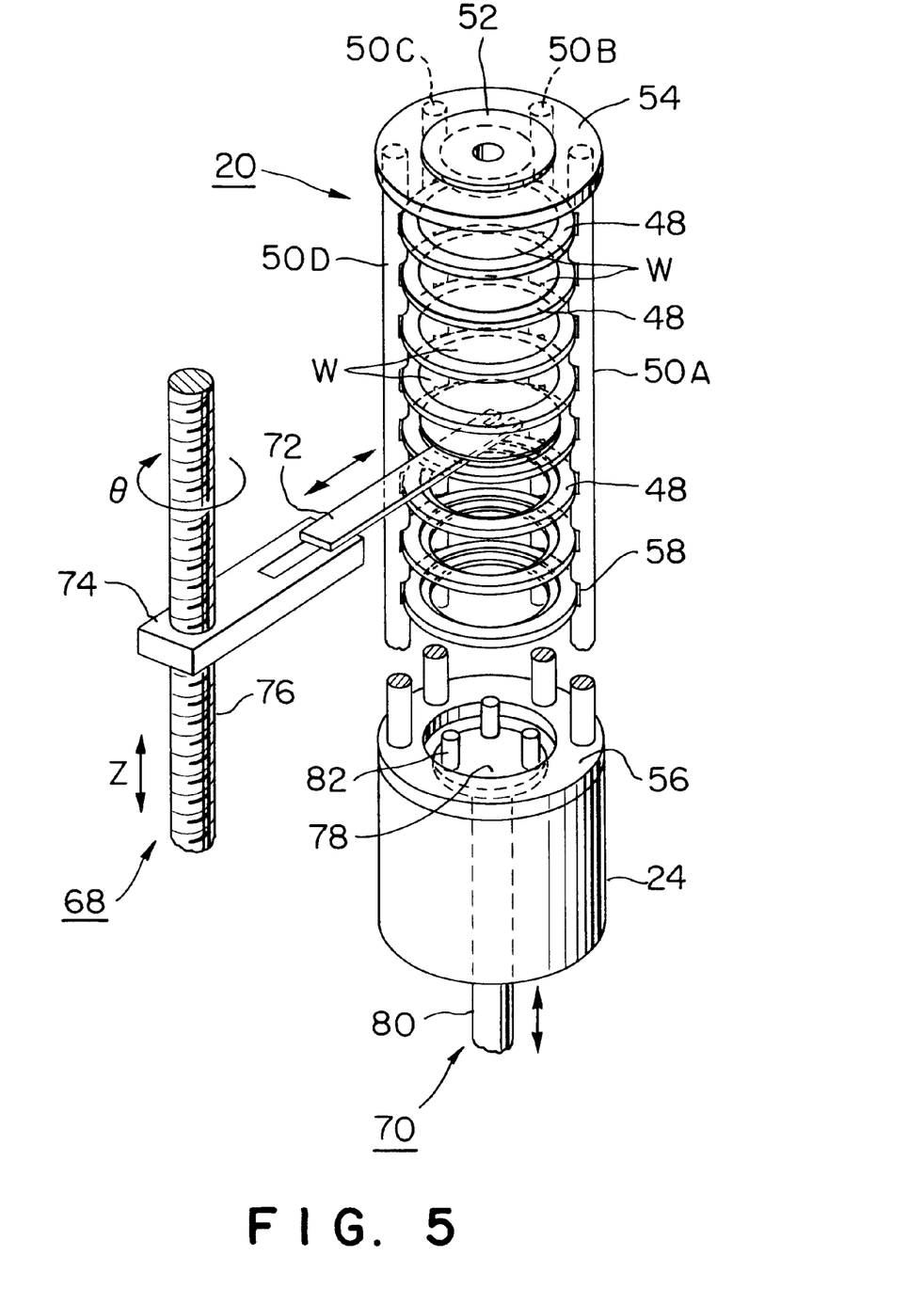
FIG. 5 is a perspective view showing a state in which an object to be processed is transferred onto the support boat according to the present invention.

FIG. 1 is a vertical sectional view of a vertical FTP including a support boat for objects to be processed. FIG. 2 is a broken perspective of the support boat, which shows the upper end thereof. FIG. 3 is a vertical sectional view of the support boat shown in FIG. 2. FIG. 4 is a vertical sectional view of the support boat with a light shielding plate mounted on. FIG. 5 is a view explaining transfer of objects to be processed onto the support boat.

As shown in FIG. 1, the vertical FTP 16 includes a processing vessel 18 of quartz of high purity having both ends opened and can accommodate the support boat (wafer boat) 20 when the support boat 20 is loaded into the processing vessel (reaction tube) 18. On an opening 18a in the lower end of the processing vessel 18 there is provided a lid 22 which is connected to a lift mechanism (not shown) to be moved up and down to be air-tight contacted to and left from the opening 18a. The support boat 20 is rotatably mounted on the lid 22 through a heat insulating cylinder 24 of quartz in a hollow cylindrical shape. Semiconductor wafers W, objects to be processed are supported in the support boat 20 on multi-stages which are spaced from each other by a certain vertical pitch.

On the ceiling of the processing vessel 18 there is provided a processing gas feed nozzle 26 which introduces a processing gas from a processing gas source into the processing vessel. An exhaust nozzle 28 connected to an exhaust pump now shown is provided in a lower part of the side wall of the processing vessel 28. An atmosphere in the processing vessel 18 is exhausted through the exhaust nozzle 28.

A heat insulating member 30 is provided on the outside of the processing vessel 18 in such a manner as to cover the entire processing vessel 18. A heater 32 for heating the processing vessel 18 is provided on the entire inside surface of the heat insulating member 30. The heater 32 is formed of, e.g., molybdenum disilicate (trade name: KANTHAL SUPER HATSUNETSUTAI) and has a calorie per a unit area as high as, e.g., 10–30 watt/cm$^2$ so as to enable fast temperature increase of the wafers W.

A ring-shaped blast header 36 connected to a blast fan 34 is provided on the lower end of the heat insulating member 30. Some blast nozzles 38 are extended from suitable parts of the ring-shaped blast header 36 in a space between the processing vessel 18 and the heat insulating member 30. When a wafer temperature is lowered after a heat treatment, cooling air is injected through the blast nozzles 38 to forcedly cool the wafers for fast temperature decrease.

An exhaust duct 40 is connected to the ceiling of the heat insulating member 30 and exhausts the cooling air injected through the blast nozzles 38. In the exhaust duct 40 there are inserted an opening/closing turning shutter 42, a cooling mechanism 44 for cooling the exhaust air and an exhaust fan 46 downstream in the stated order.

Then the support boat 20 for objects-to-be-processed of the present invention will be detailed.

As shown in FIGS. 2 to 4, the support boat 20 mainly comprises a number of support shelves 48 formed in a perfect ring, a plurality of support bars 50A–50B which hold the support shelves spaced from each other by a certain vertical pitch, and the light shielding plate 52 disposed on the top end of the support boat 20.

Specifically, the plural support bars are four support bars 50A–50D in the example shown in FIG. 2. The support bars are formed of quartz or silicon carbide (SiC), which has good heat resistance, and are secured at both ends thereof by a top ring member 54 and a bottom ring member 56 which are formed of, e.g., transparent quartz or silicon carbide (see FIG. 1).

Insert grooves 58 are formed in each of the support bars 50A–50D in multi-stages spaced from each other by a certain vertical pitch. Outer peripheral parts of the ring-shaped support shelves 48 for mounting wafers W are inserted in the respective insert grooves 50, and the support shelves 48 are formed in multi-stages which are spaced from each other by a certain vertical pitch. The support shelves 48 as well as the support bars 50A–50D are formed of quartz or silicon carbide. A stepped mount 60 is formed in an inner peripheral part of the upper surface of each ring-shaped support shelf 48 and has a diameter which is slightly smaller by, e.g., some mm than a diameter of the wafers W. The peripheral parts of the wafers W are mounted on the stepped mounts 60 to be supported. An outer diameter of the support shelves 48 is made a little larger, e.g., by about 200 mm than a wafer size, e.g., 8 inches (200 mm). A vertical pitch of the support shelves 48 is set at, e.g., 10–12 mm. This allows totally about 63 support shelves to be accommodated.

The light shielding plate 52 characterizing the present invention comprises, as shown in FIG. 4, an insert 52B in the shape of a thin cylinder and a flange 52A provided therearound, and the insert 52B is inserted in a through-hole 62 formed in the center of the top ring member 54. The light shielding plate 52 is formed of opaque quartz of high purity containing no impurity or opaque silicon carbide and shields heat rays (lights) from the heater, etc.

To adjust a transmission amount or a calorie of the heat rays the flange 52A has various diameters, and the light shielding plate 52 has various thicknesses. The light shielding plates 52 of such different sizes are prepared, and one of the light shielding plates 52 that is the most suitable for treatment conditions is selected and mounted on.

A material of the light shielding plate 52 is formed of opaque quartz of high purity containing no impurity or opaque silicon carbide which is made opaque specifically by mixing air bubbles in the material or forming numerous scars in the surface to be like devitrified glass. It is also possible to make the material opaque by mixing a coloring chemical in the material.

A beam hole 66 may be formed in the center of the light shielding plate 52 for passing light beams from a photosensor 64 (see FIG. 3) which detects presence of a wafer when the wafer is transferred.

To transfer a wafer W onto the support boat 20 of the above-described structure, as shown in FIG. 5, wafer transfer means 68 and wafer push-up means 70 are used. The wafer transfer means 68 includes a fork holding mechanism 74 which supports a transfer fork 72 for holding a wafer W on the forward end capably of advancing and retreating. A ball screw mechanism 76, for example, permits the holding mechanism 74 to move up and down in Z direction and to rotate on the axis of the ball screw mechanism 76 in θ direction.

The wafer push-up means 70 includes a push-up plate 78 which is freely moved up and down by a lift mechanism 80, such as a ball screw or others. A plurality, e.g., 3 of projections 82 are provided on the upper surface of the push-up plate 78. The push-up plate 78 is moved up and down in a space inside the support boat 20 to push up a wafer W at the backside thereof.

Next, the operation of the support boat according to the present embodiment, which has the above-described structure will be explained.

As shown in FIG. 5, wafers W to be treated are mounted and held on the support shelves 48 of the support boat (wafer boat) by the use of the wafer transfer means 68 and the wafer push-up means 70. The transfer fork 72 holding a wafer W to be treated is inserted in between the support shelves 48, and in this state the push-up plate 78 is moved up to push the backside of the wafer W by the projections 82 extended from the push-up plate 78 and transfers the wafer W to the side of the push-up plate 78.

In this state the transfer fork 72 is retreated, and then the push-up plate 78 is moved down, whereby the backside of the peripheral part of the wafer W is brought into abutment on the stepped mount 60 of the ring-shaped support shelve 48. And the wafer W is transferred onto the support boat 20. This operation is repeated to mount all wafers W on the support boat 20. When the treated wafers W are taken out of the support boat 20, the operation reverse to the above-described operation is repeated one by one for all the wafers W.

The support boat 20 which has been thus loaded with the wafers W is placed by the boat transfer mechanism (not shown) onto the lid 22 shown in FIG. 1. A boat elevator (not shown) is driven to move up the support boat 20 into the processing vessel 18 through the bottom opening 18a, air-tight closing the bottom opening 18a by the lid 22.

The processing vessel 18 is heated in advance to, e.g., about 400° C., and after the support boat 20 has been led into the processing vessel 18, the wafers W are heated and have a temperature increased in the processing vessel 18 up to a process temperature, e.g., about 1050° C. at a very high temperature increase rate of, e.g., about 100° C./min.

Simultaneously therewith, the interior of the processing vessel 18 is exhausted or evacuated to a prescribed pressure. When a process pressure and the process temperature therein are established, a required processing gas is fed into the processing vessel to make a prescribed heat treatment, as of oxidation or others, on the surfaces of the wafers W. The heat treatment includes oxidation with singly hydrochloric acid, and hydrochloric acid and oxygen, with oxygen and water vapor, and with others. Nitrification includes nitrification with nitrogen gas and oxygen.

In the conventional support boat, when wafers W have a temperature increased at a high rate, the wafers W are heated to raise the temperature with disuniform intra-surface temperature distribution in those of the wafers W near the top of the support boat. The structure of the support boat 20 according to the present invention can remove such disadvantage and can drastically suppress disuniformity of an intra-surface temperature distribution of wafers near the top of the support boat. That is, in the support boat of the conventional structure in which the support shelves 48 are simply ring-shaped, wafers near the top of the support boat have temperatures increased in the temperature distribution of FIG. 9B in which the central parts of the wafers have higher temperatures. In the support boat according to the present invention, as shown in FIG. 2, because of the light shielding plate 52 provided on the top ring member 54, which is exposed directly to the heater 32, heat rays from the heater 32 are blocked by the light shielding plate 52 to thereby suppress excessive heating of the ring member 54 and the central parts of the wafer W on the top support shelf. Concurrently radiation heat from the ring member 54 and the uppermost wafer W is lessened. As a result, excessive temperature increase at the central parts of a plurality of wafers near the top of the support boat 20 can be suppressed.

Accordingly dummy wafers, which are to be mounted on the support shelves on the side of the top of the support boat 20 and cannot be products can be much decreased. Instead more proper wafers for a decreased number of dummy wafers can be treated, and higher throughputs can be obtained. Otherwise, the processing vessel can be shorter by a length corresponding to a much decreased number of dummy wafers.

Wafers on the side of the top of the support boat can have intra-surface temperature distributions at the time of the temperature increase controlled, as described above, by changing diameters or thicknesses of the light shielding plate 52 to thereby adjust light shielding areas and heat capacities of the light shielding areas. The light shielding plate 52 can have suitable dimensions depending on treatment conditions.

The result of comparison of intra-surface temperature differences of wafers between the conventional support boat and the support boat according to the present invention will be explained with reference to FIGS. 6A and 6B.

Figure 6A:
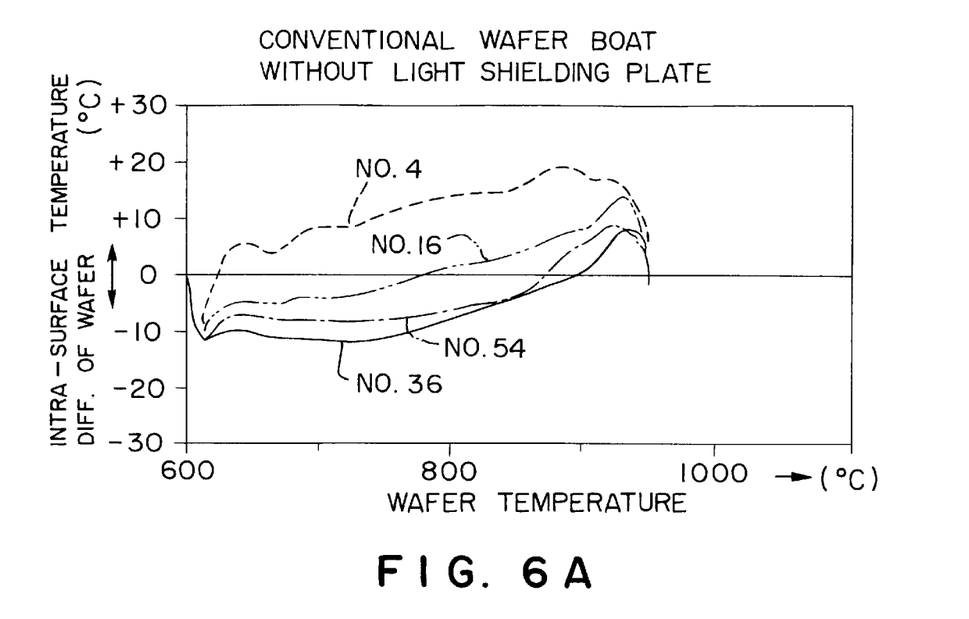
FIGS. 6A and 6B are graphs of the result of comparison between intra-surface temperature differences of wafers mounted on the conventional support boat and on the support boat according to the present invention.

FIG. 6A shows relationships between wafer temperatures and intra-surface temperature differences in the conventional support boat without the light shielding plate. FIG. 6B shows relationships between wafer temperatures and intra-surface temperature differences in the support boat according to the present invention having the light shielding plate. In these graphs, plus intra-surface temperature differences indicate that the central parts of wafers have higher temperatures. As the temperature increasing condition, temperatures were increased between 600–950° C. at a 1000° C./min. rate. Sixty-three sheets of wafers were mounted on the respective support boats. Measured results on No. 1 which is the uppermost wafer, No. 4, No. 16, No. 34 and No. 54 (the 9-th from the bottom) were plotted. As apparent in these graphs, in the case of the conventional support boat, when No. 4, which is the 4-th from the top, is noted, the temperatures at the central part thereof are higher by substantially above 10° C., often about 20° C. than at the peripheral part thereof. This is unpreferable.

Figure 6B:
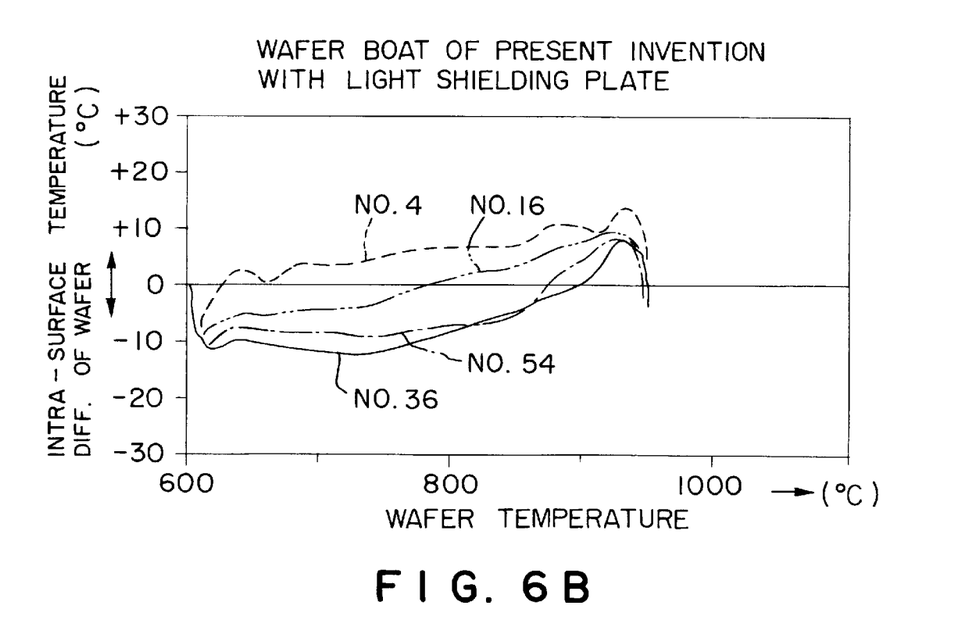

In contrast to this, in the support boat (with the light shielding plate) according to the present invention shown in FIG. 6B, the temperatures at the central parts of No. 4, which is the 4-th from the top, are rather suppressed and have the maximum temperature difference of about 10° C. from those of the peripheral part thereof. This shows that the wafers have an improved intra-surface temperature distribution.

Thus, the heat history of wafers near the top of the support boat can be approximated to that of wafers positioned on the intermediate support shelves, which can minimize dummy wafers.

Materials of the light shielding plate 52 are not limited to the above-described opaque quartz and opaque SiC and may be any as long as it has good heat resistance and light shielding.

In the above-described embodiment, the light shielding plate is provided only on the top of the support boat but an Si wafer itself may be used. The light shielding plate may be provided on the bottom of the support boat having the same heat conditions, whereby dummy wafers at the bottom of the support boat can be minimized. The processing vessel can have a shorter furnace length.

The support shelves provided in the support boat do not have essentially a ring-shape but may have an arcuate shape or a horseshoe-shape.

Heat treatments intended by the present invention are not limited to the above-described formation of oxide films and nitride film, but may be other heat treatments, such as heat diffusion, etc.

As described above, the support boat for objects-to-be-processed according to the present invention can attain the following good effects. That is, the light shielding plate is provided on the top of the support boat to block heat rays, whereby the objects-to-be-processed near the top of the support boat can increase their temperatures without being more heated at the central parts thereof than the peripheral parts thereof, and the objects to be processed can have uniform intra-surface temperature distributions. Accordingly the objects near the top of the support boat and the objects on the intermediate support shelves of the support boat can have the same heat history, and the objects to be processed can have the same tendency of temperature gradients. As a result, dummy objects to be processed can be minimized to thereby obtain higher throughputs and to allow the processing furnace to decrease the height (furnace length) itself.

What is claimed is:

1. A support boat for objects-to-be-processed including a plurality of support shelves formed in multi-stages spaced from each other by a vertical pitch for mounting a plurality of objects-to-be-processed which are to be heat treated in a vertical heat treatment apparatus; and a plurality of support bars for interconnecting said support shelves vertically spaced from each other and holding the same, said support boat comprising a light shielding plate disposed above an uppermost one of said support shelves for blocking heat rays from a heater for heating, wherein said light shielding plate comprises an insert formed in a thin plate cylinder and engaged in a top ring member of said support boat, and a flange formed around said insert; and wherein a diameter of said flange and a thickness of said light shielding plate are changed to obtain an adjusted transmission amount of heat rays from the heater and an adjusted heat capacity of said light shielding plate.

2. The support boat for objects-to-be-processed according to claim 1, wherein said support shelves are ring-shaped.

3. The support boat for objects-to-be-processed according to claim 1, wherein said support shelves are arcuate or horseshoe-shaped.

4. The support boat for objects-to-be-processed according to claim 1, wherein said light shielding plate is formed of opaque quartz or opaque SiC.

5. The support boat for objects-to-be-processed according to claim 1, wherein said vertical heat treatment apparatus is a heat treatment apparatus which can fast raise and lower temperatures at a rate of above 50° C./min.

6. A support boat for objects-to-be-processed including a plurality of support shelves formed in multi-stages spaced from each other by a vertical pitch for mounting a plurality of objects-to-be-processed which are to be heat treated in a vertical heat treatment apparatus; and     a plurality of support bars for interconnecting said support shelves vertically spaced from each other and holding the same, said support boat comprising a light shielding plate disposed below a lowermost one of said support shelves for blocking heat rays from a heater for heating, wherein said light shielding plate comprises an insert formed in a thin plate cylinder and engaged in a top ring member of said support boat, and a flange formed around said insert; and wherein a diameter of said flange and a thickness of said light shielding plate are changed to obtain an adjusted transmission amount of heat rays from the heater and an adjusted heat capacity of said light shielding plate.

\* \* \* \* \*